United States Patent
Reynolds (10) Patent No.: US 7,557,499 B2
(45) Date of Patent: Jul. 7, 2009

(54) DUAL LIGHT EMITTING AND ELECTROCHROMIC DEVICE

(75) Inventor: John R. Reynolds, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 290 days.

(21) Appl. No.: 11/576,616

(22) PCT Filed: Oct. 20, 2005

(86) PCT No.: PCT/US2005/037893

§ 371 (c)(1),
(2), (4) Date: Apr. 4, 2007

(87) PCT Pub. No.: WO2006/045043

PCT Pub. Date: Apr. 27, 2006

(65) Prior Publication Data

US 2008/0203910 A1    Aug. 28, 2008

Related U.S. Application Data

(60) Provisional application No. 60/620,412, filed on Oct. 20, 2004.

(51) Int. Cl.
   *H01L 51/50*  (2006.01)
   *H05B 33/00*  (2006.01)
   *G02F 1/15*   (2006.01)
   *G02F 1/153*  (2006.01)

(52) U.S. Cl. .................. 313/503; 313/504; 313/506; 313/509; 359/265; 359/274; 359/267

(58) Field of Classification Search ............. 313/503, 313/504, 506, 509; 359/265–274, 296
See application file for complete search history.

(56) References Cited

U.S. PATENT DOCUMENTS

| 7,002,723 B2 * | 2/2006 | Enomoto et al. ............ 359/273 |
| 7,184,191 B2 * | 2/2007 | Mizuno et al. ............... 359/275 |
| 2003/0103021 A1 | 6/2003 | Young et al. |
| 2003/0174377 A1 | 9/2003 | Reynolds et al. |

(Continued)

FOREIGN PATENT DOCUMENTS

JP   01172887 A  *  7/1989

(Continued)

OTHER PUBLICATIONS

Wang et al. "Display device with dual emissive and reflective modes", Applied Physics Letters AIP USA, (2005), vol. 87, No. 11, pp. 113502-1 to 113052-2.

*Primary Examiner*—Mariceli Santiago
(74) *Attorney, Agent, or Firm*—Saliwanchik, Lloyd & Saliwanchik (57) ABSTRACT

A combined electrochromic/electroluminescent device includes at least one pixel 101-104. Each pixel includes a substrate 107 having an electrically conductive surface 105, and an electrochemically active counter electrode layer 110 disposed on the electrically conductive surface. An electrolyte layer 115 which provides electrolytes is disposed on the counter electrode 110. An electrically conductive layer 125 is disposed on the electrolyte layer 115. An electroactive layer 130 is disposed on the electrically conductive layer 125, the electroactive layer providing both electroluminescence and an electrochromically active working electrode, wherein the electrically conductive layer 125 provides transport of electrolytes therethrough.

17 Claims, 5 Drawing Sheets

U.S. PATENT DOCUMENTS

| | | | |
|---|---|---|---|
| 2004/0189187 A1* | 9/2004 | Chang et al. | 313/503 |
| 2005/0117192 A1 | 6/2005 | Enomoto et al. | |
| 2005/0210672 A1 | 9/2005 | Reynolds et al. | |
| 2007/0132371 A1* | 6/2007 | Liu | 313/504 |

FOREIGN PATENT DOCUMENTS

| | | | |
|---|---|---|---|
| JP | 2004271830 A | * | 9/2004 |
| JP | 2006301302 A | * | 11/2006 |

* cited by examiner

FIG. 1

Electroluminescent polymers

MEH-PPV          PPP          PFO

Electrochromic polymers

PEDOT          Ppy          PANI

Luminescent/electrochromic polymers

P3OT          Poly(bis-EDOT-Et-Cz)

FIG. 2(a)

Case #1: Metal complexes

Ru(bpy)$_3$(PF$_6$)$_2$
*tris(2,2'-bipyridyl)ruthenium[II] hexafluorophosphate*

Ru(bec-bpy)$_3$(PF$_6$)$_2$
*tris[bis(ethoxycarbonyl)-2,2'-bipyridine] ruthenium[II] hexafluorophosphate*

Case #2: New electroluminescent/electrochromic polymers

Poly(bis-OR8-phenylene-N-OR7-carbazole)

Poly(OR9-thiophene-N-OR7-carbazole)

Case #3: Electroluminescent/electrochromic materials blended in a polymer matrix

Poly(*alt*-9-dihexyl-fluorene-N-ethyl-carbazole)

blended in

PMMA

MEH-PPV blended in

PEO

DUAL LIGHT EMITTING AND ELECTROCHROMIC DEVICE

CROSS-REFERENCE TO RELATED APPLICATIONS

This application is the national stage entry of International Application No. PCT/US2005/037893, filed Oct. 20, 2005, which claims priority to U.S. Provisional Application No. 60/620,412, filed Oct. 20, 2004.

FIELD OF THE INVENTION

The invention relates to display devices, more specifically to devices including display devices which provide light emission for low light environments and can change their color when sufficient light is available.

BACKGROUND OF THE INVENTION

Reflective active matrix displays are well known and different types of reflective display are known. Reflective displays have a significant advantage of low power consumption, but they can generally only be viewed when there is sufficient ambient light. One solution to this problem is to provide a front or back light for operation in dark conditions. This form of lighting gives rise to deteriorated image quality and increased power consumption. In particular, front lighting can affect the brightness and contrast of the displayed image, especially when the display is being used in its reflective mode.

Matrix display devices employing electroluminescent, light-emitting, display elements are also well known. The display elements may comprise organic thin film electroluminescent elements, for example using organic polymers and molecules, or else light emitting diodes (LEDs) using traditional III-V semiconductor compounds. Recent developments in organic electroluminescent materials, particularly polymer materials, have demonstrated their ability to be used practically for video display devices. These materials typically comprise one or more layers of a semiconducting conjugated polymer sandwiched between a pair of electrodes, one of which is transparent and the other of which is of a material suitable for injecting holes or electrons into the polymer layer.

Visual displays generally operate as either emitting displays (e.g. TV screens/computer CRTs) which operate well in low ambient light environments, or absorption/reflection displays (electrochromic) for applications when ambient light is required to view. Ambient light levels can vary significantly, such as in an environments which pass between dark and light states. Thus, in such environments conventional emitting displays consume significant energy for operation during intervals when the ambient light is sufficient for lower energy consumption allowing absorptive/reflective displays to be used.

SUMMARY

A combined electrochromic/electroluminescent device comprises at least one pixel, such as a pixel array. Each pixel comprises a substrate having an electrically conductive surface, an electrochemically active counter electrode layer disposed on the electrically conductive surface, an electrolyte layer providing electrolytes disposed on said counter electrode, an electrically conductive layer disposed on the electrolyte. An electroactive layer is disposed on the electrically conductive layer. The electroactive layer provides both electroluminescence and an electrochromically active working electrode, wherein the electrically conductive layer provides transport of the electrolytes therethrough. An optically transparent electrode layer is disposed on said active layer.

In one embodiment of the invention, the electrically conductive layer can comprise a porous membrane, where the electrically conductive material is disposed on a top-side of the membrane, wherein a portion of said electrically conductive material penetrates into the membrane. At least one back-side contact trace is disposed on a back-side of said membrane, wherein said electrically conductive material disposed on a top-side of said membrane is coupled by a conducting channel including the electrically conductive material through the membrane to the back-side contact trace.

The electrically conductive layer can be a porous electrode. In one embodiment, the electroactive layer comprises a first material which provides electroluminescence and a second material which provides electrochromism. In another embodiment, the electroactive layer comprises a single material which provides both electroluminescence and electrochromism, such as a metal complex or an electroluminescent/electrochromic polymer. The metal complex is preferably blended in a polymer matrix. The electroactive layer can comprise new materials which provide electroluminescence/electrochromism including poly(bis-OR8-phenylene-N-OR7-carbazole) or poly(OR-thiophene-N-OR7-carbazole).

The working electrode can comprise a cathodically coloring polymer or an anodically coloring polymer. The electrolyte layer can comprise a gel electrolyte or a solid electrolyte. The solid electrolyte can comprise an ionically conducting polymer comprising complex, the complex including at least one polymer having at least one dissolved metal salt therein. Such polymers can include poly(ethylene oxide), poly(propylene oxide), methoxyethoxyethoxy substituted polyphosphazene, and polyether based polyurethane.

A power supply is preferably connected between the electrically conductive surface and the electrically conductive layer, and between the electrically conductive layer and the optically transparent electrode layer. The power supply can be a switched power supply comprising at least one switch, further comprising a light sensor for sensing a level of ambient light, and a structure for closing said switch to provide electroluminescence when said ambient light is below a predetermined threshold level, and provide electrochromism when said ambient light is above said predetermined threshold level.

BRIEF DESCRIPTION OF THE DRAWINGS

A fuller understanding of the present invention and the features and benefits thereof will be accomplished upon review of the following detailed description together with the accompanying drawings, in which:

FIG. 2(*a*) shows some exemplary conjugated polymers by their electro-optical properties.

FIG. 2(*b*) shows some classes of materials which provide both electroluminescence and electrochromism.

DETAILED DESCRIPTION

Figure 1:
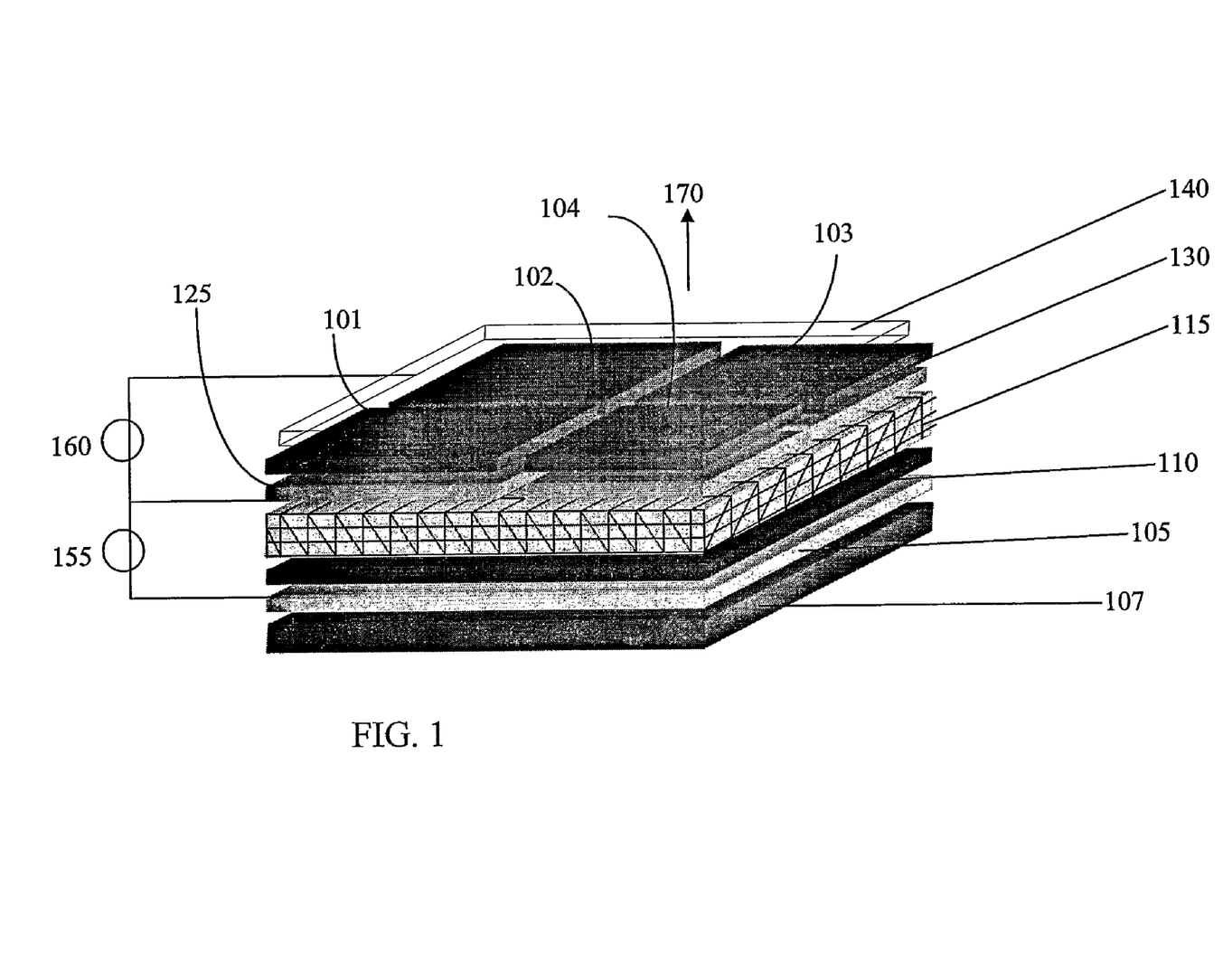
FIG. 1 shows an embodiment of a dual light emitting/electrochromic display device having a plurality of pixels, according to an embodiment of the invention.

A combined electrochromic/electroluminescent display device 100 comprising an array of display pixels 101-104 is shown in FIG. 1. Four pixels are shown only for simplicity. In most practical applications, the number of pixels provided by display device 100 will number in the hundreds, thousands, or more. The display device 100 is arranged to emit or reflect light upwardly, as represented by arrow 170.

Each pixel 101-104 includes a substrate/support 107 having an electrically conductive surface 105, an electrochemically active counter electrode layer 110 disposed on the electrically conductive surface 105, and an electrolyte layer 115 providing electrolytes disposed on the counter electrode layer 110. An electrically conductive layer 125 is disposed on the electrolyte layer 115. An electroactive layer 130 is disposed on the electrically conductive layer 125. The electroactive layer 130 provides both electroluminescence and electrochromism (the "working electrode"). The electrically conductive layer 125 provides ionic transport of the electrolytes provided by electrolyte layer 115 therethrough and electrical contact to the electroactive layer 130. Electrically conductive layer 125 is generally, but not necessarily, a porous electrically conductive material. An optically transparent electrode layer 140 is disposed on the electroactive layer 130. An optional optically transparent cover layer (not shown) can be disposed on the transparent electrode layer 140.

A first power supply 155 is shown connected between electrically conductive surface 105 and electrically conductive layer 125. A second power supply 160 is connected between electrically conductive layer 125 and optically transparent electrode layer 140. Those having ordinary skill in the art will appreciate a single switched power supply (not shown) can replace first power supply 155 and second power supply 160. For most applications, the optical transparency is generally required in the visible range.

Display device 100 can operate in either electroluminescent (EL) or electrochromic (EC) modes, depending on the bias applied. Thus, the pixels 101-104 of device 100 can either give off light (light emission) or change in color (electrochromism) based on the manner in which voltage is applied by power supplies 155 and 160. In the case of electroluminescence, the voltage applied by power supply 160 across layer 125 and 140 should be sufficient to generate at least a critical electrical field for the particular electroluminescent material comprising electroactive layer 130 to permit electroluminescence. In the case of electrochromism, the voltage applied by power supply 155 to counter electrode 110 and working electrode 130 is such that the redox state of the electrochromically active working electrode material is changed electrochemically relative to counter electrode 110. Unlike electroluminescence, the electrochromic state obtained can be retained without holding an applied voltage.

In a preferred embodiment, electrically conductive surface 105 comprises a metallic layer, such as a Au layer which coats substrate/support layer 107. Electrically conductive surface 105 disposed on substrate/support layer 107 can be optically opaque, to provide a reflecting surface. Counter electrode 110 can be selected from a wide range of electrochemically active materials. In a preferred embodiment, counter electrode 110 comprises an electrochemically active polymeric material.

In one embodiment, electrolyte layer 115 is a gel electrolyte, such as an acetanilide (ACN) solution containing poly (methyl methacrylate) and the salt $LiClO_4$. In certain applications, the incorporation of the high viscosity gel electrolyte into devices according to the invention has been found to lead to very effective electrochromism, while yielding only limited light emission. It is believed that certain gels may quench the light emission in the EL mode. This is evidenced when the electrolyte is removed, strong light emission is observed, but electrochromism is not observed as described in the Examples.

In another embodiment, electrolyte layer 115 can be a solid state electrolyte. It is expected that by using solid state electrolytes and thus converting to an all solid state cell the EL quenching sometimes experienced with certain gel electrolytes can be overcome. There are a variety of solid electrolytes that can be used with the invention. Polar polymer hosts include poly(ethylene oxide), poly(propylene oxide), methoxyethoxyethoxy substituted polyphosphazene, polyether based polyurethanes, and other similar polymers which are able to dissolve metal salts and give ionically conducting complexes. Typical metal salts include the alkali and alkaline salts ($Li^+$, $Na^+$, $Cs^+$ etc.) along with non-nucleophilic anions (tetrafluoroborate, perchlorate, triflate, and bis(trifluoromethylsulfonyl)imide, etc). Room temperatures conductivities of $10^{-5}$ to $10^{-4}$ S/cm are typically attained and are adequate for most applications of the invention. Enhanced electrochromic switching speeds can be attained with higher ionic conductivities which can be reached with these polymers at elevated temperature.

Electrically conductive layer 125 provides ionic transport of the electrolytes provided by electrolyte layer 115. In a preferred embodiment, conductive layer 125 is a porous conductive layer. As defined herein, the phrases "porous substrate" or "porous electrode" refers to a material whose surface allows penetration by a liquid.

Some known materials are inherently porous electrical conductors. Alternatively, some generally non-porous materials can be made porous, if thin enough. For example, gold layers less than about 50 to 100 angstroms are generally porous as defined herein.

A porous electrically conductive layer can also be formed from generally non-porous materials using processes well known in the field of batteries where porous electrodes are required. For example, one method of producing porous electrodes is to plate a metal (e.g. nickel) onto a porous substrate (foam or woven fibers) and then burn off the substrate to leave a fine porous metal structure. The production process is a plating process so has the same features as other plating processes. As a further alternative, a generally non-porous material can be formed or patterned to have a plurality of openings.

In a preferred embodiment, electrically conductive layer 125 is disposed on a porous substrate (not shown), such as by depositing the electrically conductive material on a front-side of the porous substrate. Conductive traces to contact pads contacting the pixels comprising conductive layer 125 can be conventionally disposed on the front of the porous substrate. Alternatively, conductive traces to contact pads can be disposed on the backside of the porous substrate. In the case of backside contact, a conducting channel including the electrically conductive material disposed on the top of the porous substrate can connect through the porous substrate to the electrically conductive traces on the back-side of the substrate. Published U.S. application No. 20050210672 entitled "A METHOD TO CONTACT PATTERNED ELECTRODES ON POROUS SUBSTRATES AND DEVICES THEREBY" published on Sep. 29, 2005 describes porous substrate aspects and includes inventors including the inventor named in the present invention. Such an arrangement provides a significant improvement to both the appearance and density of reflective electrochromic devices by allowing back-side contact to patterned working electrodes on porous metallized substrates.

When a porous substrate is used, a bias is applied between counter electrode layer 110 (through conductive layer 105) and the working electrode 130. Contact to working electrode 130 is provided by contact to front or back-side traces (not shown), through the porous substrate (not shown) to conductive layer 125 to reach layer 130. Porous substrate can comprise, for example, a polycarbonate membrane having a 10 μm average pore size, such as provided by Osmonics, Inc. or filter paper.

A typical thickness for electroactive layer 130 is 50 to 500 nm. As noted above, electroactive layer 130 provides both electroluminescence and electrochromism. In a first embodiment, electroactive layer 130 includes a first material which provides electroluminescence and a second material which provides electrochromism. The first and second materials can be intermixed (blended), stacked on one another, or patterned (e.g. as stripes or pixels) on a surface.

Figure 2A:
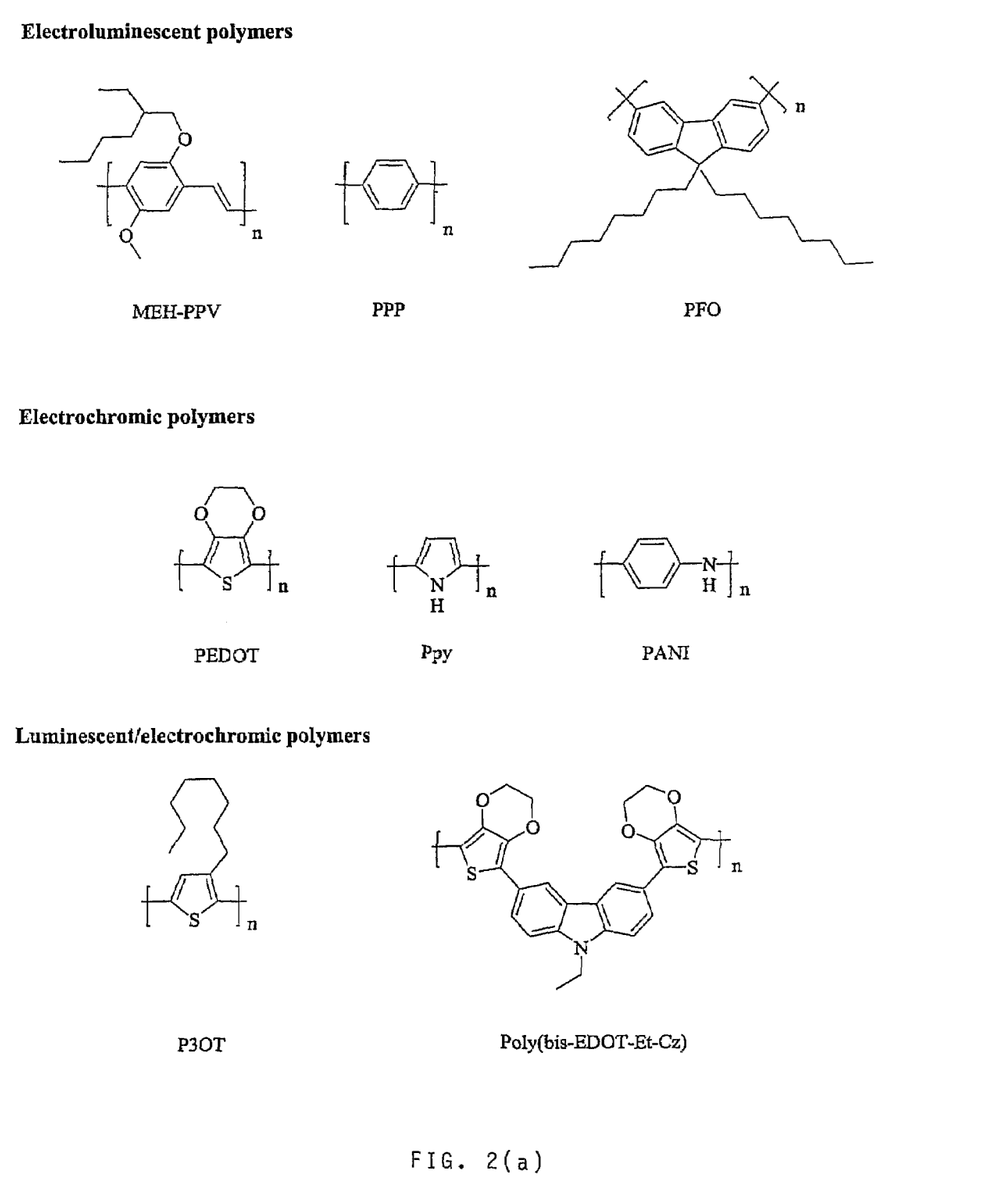

FIG. 2(a) shows the structure of exemplary electroluminescent polymers comprising MEH-PPV, PPP and PFO as well as exemplary electrochromic polymers comprising PEDOT, Ppy and PANI. One or more electroluminescent polymers can be used together with one or more electrochromic polymers to provide the desired electrochromic and electroluminescence required for electroactive layer 130, with the respective representative polymer structures performing the noted function well.

In a preferred embodiment, electroactive layer 130 consists of a single material which provides both electroluminescence and an electrochromically active working electrode material. Exemplary materials which provide both electroluminescence and electrochromism are shown in FIG. 2(a) include P3OT and poly(bis-EDOT-Et-Cz).

Figure 2B:
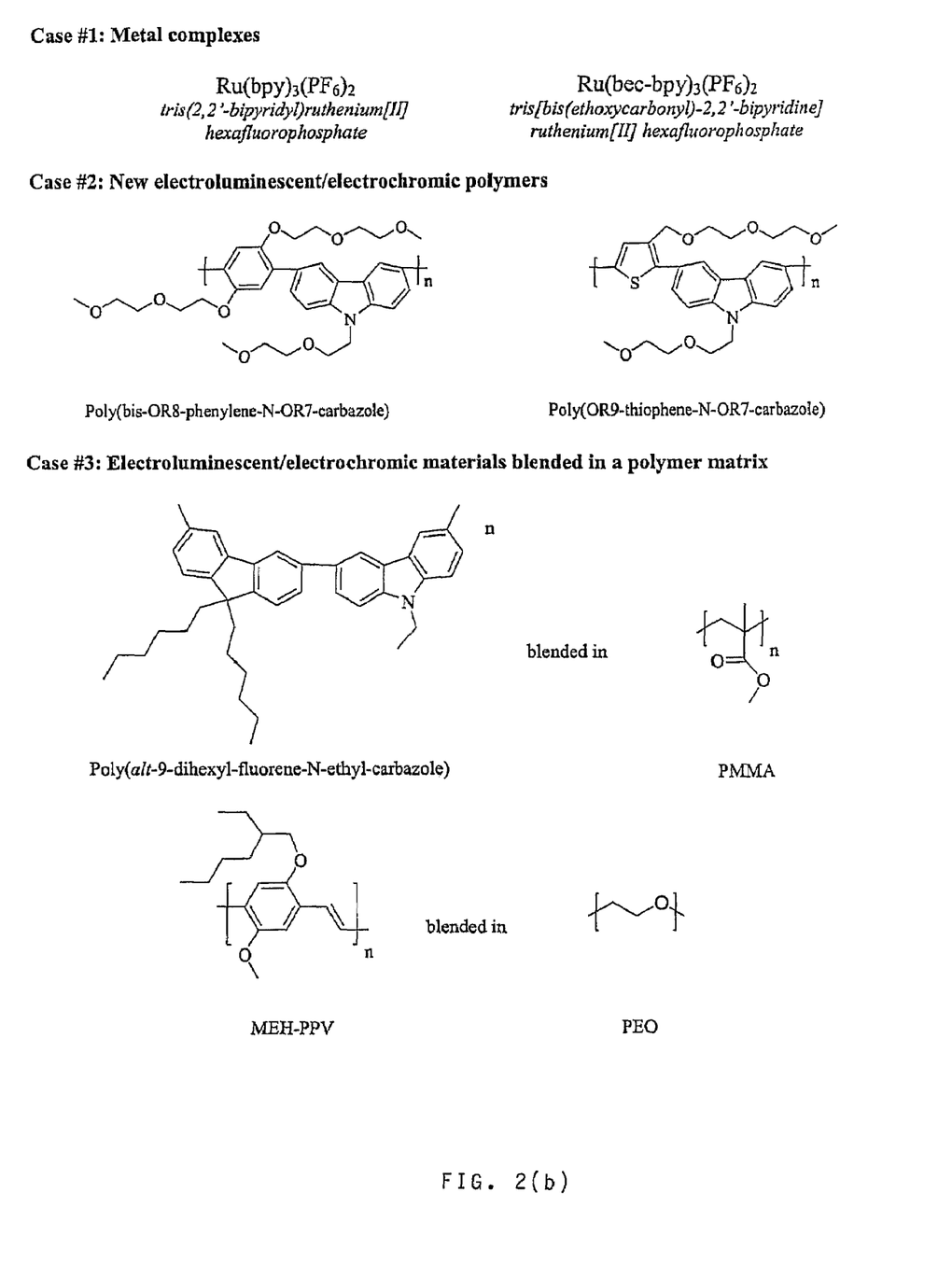

FIG. 2(b) shows some additional exemplary compositions of materials which provide both electroluminescence and electrochromism for electrochromic/electroluminescent devices according to the invention. A first class of materials comprise metal complexes. $Ru(bpy)_3(PF_6)_2$ tris(2,2'-bipyridyl)ruthenium[II] hexafluorophosphate and $Ru(bec-bpy)_3(PF_6)_2$ tris[bis(ethoxycarbonyl)-2,2'-bipyridine] ruthenium [II] hexafluorophosphate are examples of this metal complex class shown in FIG. 2(b) which can be used alone or blended into an inert polymer matrix.

A second class of materials are novel electroluminescent polymers. FIG. 2(b) shows structures for poly(bis-OR8-phenylene-N-OR7-carbazole) and poly(OR9-thiphene-N-OR7-carbazole) as examples of this class of polymers.

A third class of materials comprise electroluminescent/electrochromic materials blended in a polymer matrix. FIG. 2(b) shows Poly(alt-9-dihexyl-fluorene-N-ethyl-carbazole) which is blended in PMMA as well as MEH-PPV blended in PEO.

Optically transparent electrode layer 140 can comprise materials including indium tin oxide (ITO), or fluorine doped tin oxide. Alternatively, optically transparent electrically conducting polymers can be used, such as PEDOT/PSS.

Although not shown, display device can include a pixel drive circuit as known in the art, such as disclosed in published U.S. Pat. Application No. 20030103021 to Young et al. The pixel drive circuit (not shown) selects which pixels are in the on or off (EL mode), and which pixels are in a specific color state, including intermediate color states (EC mode). Generally, a color state is used when the EL is off, and the EC polymer is initially neutral when the EL is turned on. The EC polymer can be colored or transmissive in EL mode. Since the EC state does not require a bias to retain its color, the EC state is an energy saving mode and is said to have "memory".

In one embodiment, counterelectrode layer 110 and electroactive layer 130 both include electrochemically active polymeric materials. Electroactive layer 130 can be a cathodically coloring or anodically coloring polymer. When electroactive layer 130 is a cathodically coloring polymer a negative bias is applied to layer 130 with respect to counter electrode 110 produces a colored state. When the electroactive layer includes an anodically coloring polymer, a positive bias applied to layer 130 with respect to counter electrode 110 produces a colored state.

The cathodic coloring polymer preferably provides a band gap (Eg)<or=2.0 eV in its neutral state. For example, the cathodically coloring polymer can comprise a poly(3,4-alkylenedioxyheterocycle), such as alkylenedioxypyrrole, or alkylenedioxythiophene. The poly(3,4-alkylenedioxyheterocycle) can comprise a bridge-alkyl substituted poly(3,4-alkylenedioxythiophene), such as $PProDOT-(methyl)_2$, $PProDOT-(hexyl)_2$, or $PProDOT-(ethylhexyl)_2$.

The electrochemically active working electrode provided by electroactive layer 130 can be an anodically coloring polymer. A wide range of such materials are available, such as PPV or PPP derivatives.

U.S. Pat. No. 6,791,738 ('738) entitled ELECTROCHROMIC POLYMERS AND POLYMER ELECTROCHROMIC DEVICES describes some semiconducting electrochromic polymers including high band polymers having band gaps >3.0 eV. Named inventors for '738 include the inventor named in the present invention. Electrochemically active anodically coloring polymers disclosed prior to '738 are generally not optically clear and colorless in their transmissive states because the band gaps provided are not sufficiently high for the $\pi$-$\pi$* absorption to be excluded from the visible region, thus providing coloration to the transmissive state of the devices. For examples, band gaps of such polymers are generally no more than 2.7 eV. To be optically clear, an anodically coloring polymer must provide a band gap in its neutral state of at least about 3.0 eV, since 410 nm (violet) light corresponds to a photon energy (E) of about 3 eV. (E=hc/λ; where h is Plank's constant and c is the speed of light). A high band gap polymer is not required for use with the invention, but can provide a highly transmissive state for the electroactive layer 130 allowing the reflective metal electrode 125 to be visible when desired for a given application.

The EL material can be selected from a wide range of materials. For example, the EL material can be MEH-PPV, PPP or PFO shown in FIG. 2(a), or provided by a single material which provides EL and EC, such as shown in FIG. 2(b).

The invention is expected to have a wide range of applications since displays according to the invention can operate independent of ambient light. Any form of display in which one would want to have either emission of light or change of color on surface can benefit from the invention. Some exemplary applications include 1. Advertising and signage visible day or night without an external light source.
2. Electronic books and electronic paper readable in bright, low, and no light.
3. Emergency/safety lighting visible and operating (e.g. switching) independent of ambient lighting.
4. Computer screens visible in both bright light and low/no light
5. Camouflage
6. PDAs, cell phone displays and related devices.

As one example, consider a person using a PDA on a train or bus moving from bright light on the screen into a tunnel repeatedly. In the bright light, the screen can be operated in electrochromic mode. Electrochromic devices inherently operate with electrochromic memory since once the color change is set by an appropriate redox reaction, no current is required at that pixel. Thus, electrochromic operation uses less energy than emitting devices which require constant power consumption, thus allowing longer operating times for the power supply used in the system, typically a battery. Upon entering the dark tunnel, the user (or a light sensor based on some light level threshold) flips a switch to light emitting mode wherein the display will be visible in the dark. Light sensors known in the art can be based on a variety of devices including photodiodes photoresistors, phototransistors, or CCDs.

EXAMPLES

The present invention is further illustrated by the following specific simulation Examples, which should not be construed as limiting the scope or content of the invention in any way.

Example 1

A device was constructed in order to make use of both the electrochromic and electroluminescent properties of certain metal complexes. Stock solutions of poly(methyl methacrylate) (PMMA), and the metal complex tris(2,2'-bipyridyl) ruthenium(II) hexafluorophosphate ([Ru(bpy)$_3$][PF$_6$]$_2$), (FIG. 2(b)) were prepared in acetonitrile with concentrations of 33 mg/mL and 53 mg/nL, respectively. PMMA serves as an inert matrix which provides good film forming properties. These solutions were blended in a 1:3 volumetric ratio. Composite films were spin cast from this solution onto an ITO coated glass at a rate of 2000 rpm to yield a thickness of 100 nm. The film on the glass ITO substrate was kept under vacuum at room temperature for 1 h and then heated under vacuum to 120° C. for 2 h.

A porous gold membrane with a gold thickness of about 100 nm was then placed on the top of the film. A small amount of electrolyte was spread on the porous gold membrane. PEDOT, that was electrochemically deposited on gold. MYLAR® was placed at the very top facing towards the gold to serve as the counter electrode material 110. Connections to the two gold electrodes and the ITO electrode were made by copper bands. The porous gold membrane and the ITO were accessed as electrodes in order to run the device in light emitting electrochemical cell mode, while the ITO and the gold MYLAR® electrodes were utilized to lull the device in electrochromic mode.

Example 2

A device was constructed using MEH-PPV which as noted above is a material which provides both electrochromism and electroluminescence. A 5 mg/mL solution of poly[2-methoxy-5-(2'-ethyl-hexyloxy)-1,4-phenylene vinylene] (MEH-PPV), poly(ethylene oxide) (PEO), lithium trifluoromethanesulfonate (Li triflate), in dichloroethane with weight ratio of 1:1:0.18 was prepared. Composite polymer films were spin cast from this solution onto an ITO coated glass at a rate of 2000 rpm to yield a thickness of 200 nm. That film on the glass ITO substrate was heated under vacuum at 80° C. for 2 h.

A porous gold membrane with a gold thickness of 100 nm was then placed on the top of the film. A small amount of electrolyte was spread on the porous gold membrane. PEDOT, that was electrochemically deposited on gold MYLAR® was placed at the very top facing towards the gold. Connections to the two gold electrodes and the ITO electrode were made by copper bands. The porous gold membrane and the ITO were accessed as electrodes in order to run the device in light emitting electrochemical cell mode, while the ITO and the gold MYLAR® electrodes were utilized to run the device in electrochromic mode.

Example 3

Figure 3:
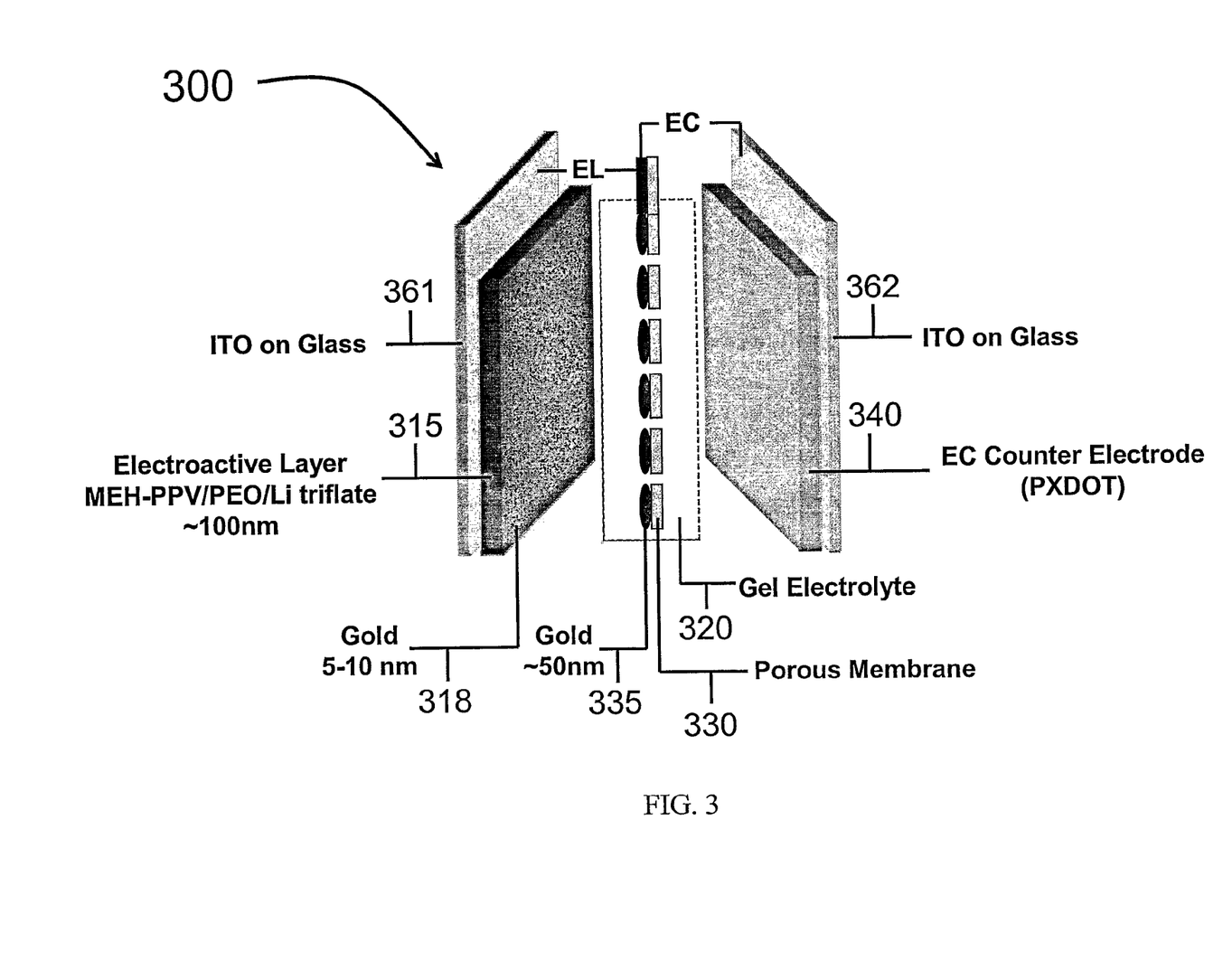
FIG. 3 shows exemplary layers comprising a dual EL/EC device according to the invention shown partially separated to facilitate description of fabrication steps to form the dual EL/EC.

FIG. 3 shows exemplary layers comprising a dual EL/EC device 300 according to the invention shown partially separated to facilitate description of fabrication steps to form the dual EL/EC. Depending on where the bias is applied, shown as EC and EL in FIG. 3, the device 300 will change color (EC mode) or emit light (EL mode). This is possible because both EL and EC operations require an electroactive layer 315 (MEH-PPV). The EL mode may use an ionic conductive material blended with the light emitting material. The EC mode uses an ionic transport layer 320 shown as a gel electrolyte. Electroactive layer 315 includes a thin gold layer 318 thereon. The use of a porous membrane (substrate) 330 having gold 335 thereon as the middle electrode in this hybrid EL/EC device 300 ensures fast transfer of ions between the electrochemically active layers and electrical contact to the outside of the device. Moreover, when placed next to one another in the completed device thin gold layer 318 on the electroactive layer 315 together with gold layer 335 on the membrane 330 effectively provides a single layer of gold with a good electrical contact. The counter electrode, shown as oxidized PXDOT 340 completes the active portion of device 300. Optically transparent ITO on glass layers 361 and 362 sandwich the active portion of device 300.

Regarding fabrication, a mixture of MEH-PPV, PEO (chemical structures shown in FIG. 2(b)), and Li triflate (see below for respective chemical structure) were spun cast from dichloroethane on a clean ITO/Glass (1 inch×1 inch) substrate to form the electroactive MEH-PPV layer 315. A thin layer of gold (~10 nm) 318 was then vapor deposited onto the MEH-PPV layer 315 through a mask at high vacuum (~4× 10$^{-7}$ Torr). The middle contact was formed by depositing 100 nm gold 335 on a microporous membrane 330 (Pore size: about 10 μm). The middle contact was then pressed onto the MEH-PPV layer 315 to ensure electrical contact between the gold layers 318 and 335. A thin film of PXDOT (structure shown below) was separately deposited on an ITO/Glass substrate (electrochemically polymerized or solution cast) and was electrochemically oxidized to form the counter electrode 340. This counter electrode 340 was then placed on the middle contact (face down) separated by a thin layer of ionically conducting gel electrolyte 320.

PXDOT             Li Triflate

Photographs of the electrochromic operation of a patterned EL/EC device 300 (after pressing together) between the orange/red and transparent light blue states were recorded.

The device was switched between +1V and −1V using patterned gold contacts (Contact area=0.07 cm$^2$). When +1V was applied between the working electrode 315 through middle contact 335 and the counter electrode 340 through ITO 362, the MEH-PPV working electrode layer 315 became oxidized and PXDOT layer 340 was reduced which results in discoloration of the device to show the light blue of the MEH-PPV and the blue color of PXDOT layer 340 underneath. This switching was shown to be reversible by repeating this sequence multiple times.

Figure 4A:
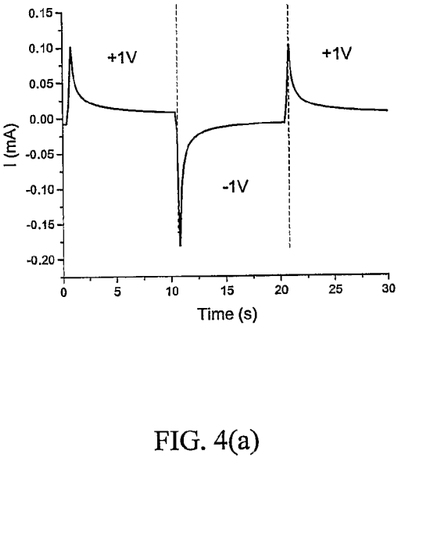
FIGS. 4(a) and (b) show electrochemical switching and reflectance spectra of an exemplary EL/EC device according to the invention at two extreme states (±1V), respectively.
Figure 4B:
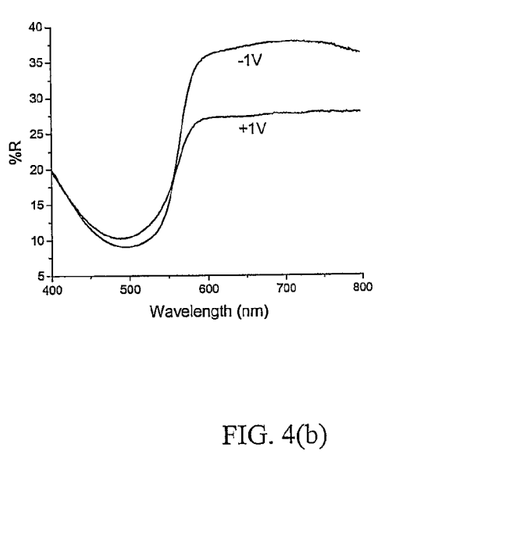

FIG. 4(a) shows the current-voltage characteristics of this device when ±1V was applied for 10 seconds and the current was monitored against time. The switching time was determined to be about 3 seconds from the decay of the current. The maximum current values are about 0.1 mA which is typical for polymer based electrochromic devices. FIG. 4(b) shows the reflectance spectra of this device at two extreme states (±1V) in the visible region. At −1V, the MEH-PPV layer is neutral with a reflectance minimum at about 510 nm. When the bias is switched to +1V, MEH-PPV is oxidized (bleached) to yield higher reflectance (lower absorption) values at 510 nm. This also results in coloring of the PEDOT layer underneath to yield lower reflectance values at wavelengths above 580 nm.

When the device was biased for EL operation and −6V was applied between the MEH-PPV layer and the middle contact, the device lit up for a short period of time followed by complete oxidation (discoloration) of the MEH-PPV layer.

As a control, Another EL/EC device was fabricated with the same configuration as described relative to Example 3, except without the presence of the gel electrolyte layer 320. As expected, this device did not show electrochromism as there was no ionically conducting medium to transfer charges between the MEH-PPV working electrode layer and the counter electrode. EL operation of this device yielded light emission (orange) from the patterned gold contacts as expected.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

The invention claimed is:

1. A combined electrochromic/electroluminescent device, comprising at least one pixel, said pixel comprising:
   a substrate having an electrically conductive surface;
   an electrochemically active counter electrode layer disposed on said electrically conductive surface;
   an electrolyte layer providing electrolytes disposed on said counter electrode;
   an electrically conductive layer disposed on said electrolyte,
   an electroactive layer disposed on said electrically conductive layer, said electroactive layer providing both electroluminescence and an electrochromically active working electrode, wherein said electrically conductive layer provides transport of said electrolytes therethrough, and
   an optically transparent electrode layer disposed on said active layer.

2. The device of claim 1, wherein said electrically conductive layer comprises:
   a porous membrane;
   electrically conductive material disposed on a top-side of said membrane, wherein a portion of said electrically conductive material penetrates into said membrane;
   at least one back-side contact trace disposed on a back-side of said membrane, wherein said electrically conductive material disposed on a top-side of said membrane is coupled by a conducting channel including said electrically conductive material through said membrane to said back-side contact trace.

3. The device of claim 1, wherein said electrically conductive layer is a porous electrode.

4. The device of claim 1, wherein said electroactive layer comprises a first material which provides electroluminescence and a second material which provides electrochromism.

5. The device of claim 1, wherein said at least one pixel comprises an array of said pixels.

6. The device of claim 1, wherein said electroactive layer comprises a single material which provides both electroluminescence and electrochromism.

7. The device of claim 6, wherein said single material comprises a metal complex.

8. The device of claim 6, wherein said single material comprises an electroluminescent/electrochromic polymer.

9. The device of claim 7, wherein said metal complex is blended in a polymer matrix.

10. The device of claim 1, wherein said working electrode comprises a cathodically coloring polymer.

11. The device of claim 1, wherein said working electrode comprises an anodically coloring polymer.

12. The device of claim 1, wherein said electrolyte layer comprises a gel electrolyte.

13. The device of claim 1, wherein said electrolyte layer comprises a solid electrolyte.

14. The device of claim 13, wherein said solid electrolyte comprises an ionically conducting polymer comprising complex, said complex including at least one polymer having at least one dissolved metal salt therein.

15. The device of claim 14, wherein said polymer comprises at least one selected from the group consisting of poly(ethylene oxide), poly(propylene oxide), methoxyethoxyethoxy substituted polyphosphazene, and polyether based polyurethane.

16. The device of claim 1, further comprising a power supply connected between said electrically conductive surface and said electrically conductive layer, and between said electrically conductive layer and said optically transparent electrode layer.

17. The device of claim 1, wherein said electroactive layer comprises Poly(bis-OR8-phenylene-N—OR7-carbazole) or Poly(OR-thiophene-N—OR7-carbazole).

* * * * *

UNITED STATES PATENT AND TRADEMARK OFFICE
CERTIFICATE OF CORRECTION

PATENT NO. : 7,557,499 B2  Page 1 of 1
APPLICATION NO. : 11/576616
DATED : July 7, 2009
INVENTOR(S) : John R. Reynolds It is certified that error appears in the above-identified patent and that said Letters Patent is hereby corrected as shown below:

Column 1,
Line 51, "such as in an environments" should read --such as in environments--.

Column 3,
Line 67, "such as an acetanilide (ACN) solution" should read
--such as an acetonitrile (ACN) solution--.

Column 6,
Line 37, "For examples" should read --For example--.

Column 7,
Line 31, "and 53 mg/nL" should read --and 53 mg/mL--.

Column 9,
Line 29, "As a control, Another" should read --As a control, another--.

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,557,499 B2  Page 1 of 1
APPLICATION NO. : 11/576616
DATED : July 7, 2009
INVENTOR(S) : John R. Reynolds It is certified that error appears in the above-identified patent and that said Letters Patent is hereby corrected as shown below:

Column 1,
Line 7, "This application is the national stage entry of International Application No. PCT/US2005/037893, filed Oct. 20, 2005, which claims priority to U.S. Provisional Application No. 60/620,412, filed Oct. 20, 2004.

FIELD OF THE INVENTION should read --This application is the national stage entry of International Application No. PCT/US2005/037893, filed Oct. 20, 2005, which claims priority to U.S. Provisional Application No. 60/620,412, filed Oct. 20, 2004.

This invention was made with government support under Air Force Office of Scientific Research Grant No. F49620-03-1-0091 and Army Research Office/MURI (subcontract from UCLA), Grant No. DAAD 19-99-1-0316UCLA. The government has certain rights in this invention.--

Signed and Sealed this

Twenty-seventh Day of July, 2010

David J. Kappos
*Director of the United States Patent and Trademark Office*

UNITED STATES PATENT AND TRADEMARK OFFICE
CERTIFICATE OF CORRECTION

PATENT NO. : 7,557,499 B2  Page 1 of 1
APPLICATION NO. : 11/576616
DATED : July 7, 2009
INVENTOR(S) : John R. Reynolds It is certified that error appears in the above-identified patent and that said Letters Patent is hereby corrected as shown below:

Column 1,
Line 7, "This application is the national stage entry of International Application No. PCT7US2005/037893, filed Oct. 20, 2005, which claims priority to U.S. Provisional Application No 60/620,412, filed Oct 20, 2004.

FIELD OF THE INVENTION" should read --This application is the national stage entry of International Application No. PCT/US2005/037893, filed Oct. 20, 2005, which claims priority to U.S. Provisional Application No. 60/620,412, filed Oct. 20, 2004.

This invention was made with government support under Air Force Office of Scientific Research Grant No. F49620-03-1-0091 and Army Research Office/MURI (subcontract from UCLA), Grant No. DAAD 19-99-1-0316UCLA. The government has certain rights in this invention.

FIELD OF THE INVENTION--

This certificate supersedes the Certificate of Correction issued July 27, 2010.

Signed and Sealed this
Twenty-fourth Day of May, 2011

David J. Kappos
*Director of the United States Patent and Trademark Office*